(12) United States Patent
Chen et al.

(10) Patent No.: US 11,502,275 B2
(45) Date of Patent: Nov. 15, 2022

(54) DISPLAY PANEL, DISPLAY DEVICE AND MANUFACTURING METHOD THEREOF

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Yunjin Chen, Beijing (CN); Yuchun Feng, Beijing (CN); Shanshan Yang, Beijing (CN); Moli Sun, Beijing (CN); Ting Cui, Beijing (CN)

(73) Assignees: Fuzhou BOE Optoelectronics Technology Co., Ltd., Fujian (CN); Beijing BOE Technology Development Co., Ltd., Beijing (CN)

(*) Notice: Subject to any disclaimer, the term of this patent is extended or adjusted under 35 U.S.C. 154(b) by 331 days.

(21) Appl. No.: 16/613,333

(22) PCT Filed: Apr. 4, 2019

(86) PCT No.: PCT/CN2019/081510
§ 371 (c)(1),
(2) Date: Nov. 13, 2019

(87) PCT Pub. No.: WO2020/001121
PCT Pub. Date: Jan. 2, 2020

(65) Prior Publication Data
US 2021/0343987 A1 Nov. 4, 2021

(30) Foreign Application Priority Data
Jun. 29, 2018 (CN) .......................... 201810717210.0

(51) Int. Cl.
*H01L 51/52* (2006.01)
*B01J 20/22* (2006.01)
(Continued)

(52) U.S. Cl.
CPC ........ *H01L 51/5259* (2013.01); *B01J 20/226* (2013.01); *B01J 21/063* (2013.01);
(Continued)

(58) Field of Classification Search
CPC ............... H01L 51/5259; H01L 51/004; H01L 51/0092; H01L 51/5256; H01L 51/56; B01J 20/226; B01J 23/06
(Continued)

(56) References Cited

U.S. PATENT DOCUMENTS

2005/0196527 A1* 9/2005 Ferrario et al. ..... H01L 51/5259
427/66
2014/0179040 A1* 6/2014 Ramadas et al. ....... H01L 51/56
438/27

FOREIGN PATENT DOCUMENTS

CN 1559075 A 12/2004
CN 1653852 A 8/2005
(Continued)

OTHER PUBLICATIONS

Chinese First Office Action dated Apr. 22, 2019 corresponding to application No. 201810717210.0.
(Continued)

*Primary Examiner* — Thinh T Nguyen
(74) *Attorney, Agent, or Firm* — Nath, Goldberg & Meyer; Joshua B. Goldberg

(57) ABSTRACT

The present disclosure provides a display panel including a substrate, an organic electroluminescent device, and an absorbing layer, wherein the organic electroluminescent device is arranged on the substrate, and the absorbing layer covers the organic electroluminescent device and the substrate. The absorbing layer includes an oxygen absorbing layer and a photocatalytic layer for catalyzing water decomposition, the photocatalytic layer covers the organic elec-
(Continued)

troluminescent device and the substrate around the organic electroluminescent device, and the oxygen absorbing layer is covered on the photocatalytic layer and the substrate around the photocatalytic layer.

19 Claims, 3 Drawing Sheets

(51) Int. Cl.
| | | |
|---|---|---|
| *H01L 51/00* | (2006.01) | |
| *B01J 21/06* | (2006.01) | |
| *B01J 23/06* | (2006.01) | |
| *B01J 27/24* | (2006.01) | |
| *B01J 35/00* | (2006.01) | |
| *H01L 51/56* | (2006.01) | |

(52) U.S. Cl.
CPC ............ *B01J 23/06* (2013.01); *B01J 27/24* (2013.01); *B01J 35/004* (2013.01); *H01L 51/004* (2013.01); *H01L 51/0092* (2013.01); *H01L 51/5256* (2013.01); *H01L 51/56* (2013.01); *H01L 2251/558* (2013.01)

(58) Field of Classification Search
USPC ........................................ 257/40; 438/82, 99
See application file for complete search history.

(56) References Cited

FOREIGN PATENT DOCUMENTS

| CN | 101154716 A | 4/2008 |
|---|---|---|
| CN | 102057750 A | 5/2011 |
| CN | 203218330 U | 9/2013 |
| CN | 108155302 A | 6/2018 |
| CN | 108899436 A | 11/2018 |

OTHER PUBLICATIONS

Chinese Second Office Action dated Aug. 23, 2019 corresponding to application No. 201810717210.0.

Chinese Third Office Action dated Nov. 8, 2019 corresponding to application No. 201810717210.0.

\* cited by examiner

DISPLAY PANEL, DISPLAY DEVICE AND MANUFACTURING METHOD THEREOF

CROSS-REFERENCE TO RELATED APPLICATIONS

This is a National Phase Application filed under 35 U.S.C. 371 as a national stage of PCT/CN2019/08151, filed Apr. 4, 2019, an application claiming the benefit of Chinese Application No. 201810717210.0, filed Jun. 29, 2018, the content of each of which is hereby incorporated by reference in its entirety.

FIELD OF THE INVENTION

The present disclosure relates to the field of display technology, and in particular, to a display panel, a display device, and manufacturing methods for the same.

BACKGROUND OF THE INVENTION

Organic electroluminescent devices (abbreviation: OLED) are widely used because of their advantages of self-luminescence, high contrast ratio, and applicable in flexible panels. Since the materials for making OLEDs are particularly sensitive to oxygen and moisture, they are easily eroded by oxygen and moisture and lose their normal performance. Therefore, before using OLEDs, it is necessary to package the OLEDs.

In this field, the OLED is generally packaged by: selecting a glass as a substrate, selecting a glass or a metal as a cover, and sealing the substrate and the cover on the back of the box with an adhesive such as an epoxy resin to package the OLED on the substrate. However, due to the poor barrier properties of the adhesive such as epoxy resin to oxygen and water vapor, the packaging of the OLED is poor, and the service life of the OLED is short.

SUMMARY OF THE INVENTION

The present disclosure provides a display panel to solve the problem of poor barrier properties to oxygen and water vapor of an adhesive such as an epoxy resin in the background art, which results in poor packaging of the OLED and short service life of the OLED.

In one aspect, a display panel is provided, comprising a substrate, an organic electroluminescent device, and an absorbing layer; the organic electroluminescent device is arranged on the substrate; the absorbing layer covers the organic electroluminescent device and the substrate, the organic electroluminescent device is packaged in a space formed by the absorbing layer and the substrate; wherein the absorbing layer comprises an oxygen absorbing layer and a photocatalytic layer for catalyzing water decomposition; the photocatalytic layer covers the organic electroluminescent device and the substrate around the organic electroluminescent device, and the oxygen-absorbing layer covers the photocatalytic layer and the substrate around the photocatalytic layer.

Further, the absorbing layer further comprises a hydrogen absorbing layer covering the organic electroluminescent device and the substrate around the organic electroluminescent device, the photocatalytic layer covers the hydrogen absorbing layer and the substrate around the hydrogen absorbing layer, and the oxygen absorbing layer covers the photocatalytic layer and the substrate around the photocatalytic layer.

Further, the absorbing layer comprises at least two layers of the photocatalytic layer and at least two layers of the oxygen absorbing layer; the photocatalytic layer and the oxygen absorbing layer are alternately stacked.

Further, the material of the photocatalytic layer is a semiconductor photocatalytic material having a band gap greater than 1.23 eV.

Further, the semiconductor photocatalytic material comprises at least one of a composite material of titanium oxide, a composite material of zinc oxide, and a composite material of carbon nitride.

Further, the material of the hydrogen absorbing layer is a hydrogen storage material.

Further, the hydrogen storage material comprises metal-organic frameworks (MOFs).

Further, the metal-organic framework is a MOFs material centered on $ZnO_4$.

Further, the metal-organic framework is MOF-5 ($Zn_4O$ $(BDC)_3$, wherein BDC is 1,4-terephthalate.

Further, the metal-organic framework is MOF-177 ($Zn_4O$ $(BTB)_2$, wherein BTB is 1,3,5-benzotribenzoate.

Further, the photocatalytic layer has a thickness of about 0.3 to 0.5 μm.

Further, the material of the oxygen absorbing layer comprises at least one of an organic polyester-based material and iron powder.

Further, said oxygen absorbing layer has a thickness of about 0.6 to 1 μm.

On the other hand, a display device is also provided, the display device comprises the display panel as described above.

On the other hand, a manufacturing method for the display panel as described above is also provided, the method comprising: providing a substrate; forming an organic electroluminescent device on the substrate; forming an absorbing layer on the organic electroluminescent device and the substrate; wherein the absorbing layer comprises an oxygen absorbing layer and a photocatalytic layer for catalyzing water decomposition, and the step of forming an absorbing layer for absorbing foreign matter on the organic electroluminescent device and the substrate comprises: forming the photocatalytic layer, the photocatalytic layer covers organic electroluminescent device and the substrate around the organic electroluminescent device, forming the oxygen absorbing layer, the oxygen-absorbing layer covers the photocatalytic layer and the substrate around the photocatalytic layer.

Further, the steps of forming the photocatalytic layer also comprises: forming a hydrogen absorbing layer, the hydrogen absorbing layer is located on a surface of the photocatalytic layer away from the oxygen absorbing layer, the hydrogen absorbing layer covers the organic electroluminescent device and the substrate around the organic electroluminescent device, the photocatalytic layer covers the hydrogen absorbing layer and the substrate around the hydrogen absorbing layer.

Further, the steps of forming the photocatalytic layer comprises: forming the photocatalytic layer by vapor deposition or magnetron sputtering; the steps of forming the oxygen absorbing layer comprises: forming the oxygen absorbing layer by vapor deposition or magnetron sputtering.

Further, the material of the photocatalytic layer is a semiconductor photocatalytic material, the band gap of the semiconductor photocatalytic material is greater than 1.23 eV, and the material of the oxygen absorbing layer comprises at least one of an organic polyester material and an iron powder.

Further, the photocatalytic layer has a thickness of about 0.3 to 0.5 μm, and the oxygen absorbing layer has a thickness of about 0.6 to 1 μm.

DETAILED DESCRIPTION OF THE INVENTION

Figure 1:
FIG. 1 is a schematic structural diagram of a first display panel according to an embodiment of the present disclosure.

The above-described objects, features and advantages of the present disclosure will become more apparent from the description in detail below in conjunction with the drawings and embodiments.

In the description of the present disclosure, unless otherwise stated, the meaning of "a plurality of" is two or more; the orientation or positional relationship of the terms "upper", "lower", "left", "right", "inside", "outside", etc. is based on the orientation or positional relationship shown in the drawings. This is for the convenience of the description of the disclosure and the simplification of the description, and is not intended to indicate or imply that the elements or components referred to must have a particular orientation or constructed and operated in a particular orientation. Therefore, it cannot be understood as a limitation on the present disclosure.

In the description of the present disclosure, unless otherwise explicitly defined and limited, it should be noted that the terms "installed", "jointed", and "connected" are to be understood broadly. For example, it can be a fixed connection, a detachable connection, or an integral connection; it can be a mechanical connection or an electrical connection; it can be directly connected or indirectly connected through an intermediate medium. For a person skill in the art, the specific meanings of the above terms in the present disclosure can be understood in specific circumstances.

The specific embodiments of the present disclosure are further described in detail below with reference to the accompanying drawings and embodiments. The following examples are intended to illustrate the disclosure, but are not intended to limit the scope of the disclosure.

An embodiment of the present disclosure provides a display panel, comprising a substrate, an organic electroluminescent device, and an absorbing layer; the organic electroluminescent device is arranged on the substrate; the absorbing layer covers the organic electroluminescent device and the substrate, the organic electroluminescent device is packaged in a space formed by the absorbing layer and the substrate.

The embodiment of the present disclosure proposes a packaging design concept of actively consuming foreign matter, introducing an absorbing layer into the display panel, the absorbing layer actively absorbing foreign matter, eliminating foreign matter from the source, and effectively isolating the foreign matter from contacting the organic electroluminescent device, preventing corrosion of organic electroluminescent devices by foreign matter, it can be seen that the arrangement of the absorbing layer ensures the stability of the performance of the organic electroluminescent device, so that the organic electroluminescent device has a long service life.

The absorbing layer has a function of absorbing foreign matter, and the type of the absorbing layer can be set according to the kind of the foreign matter to be absorbed. For example, the absorbing layer may include an oxygen absorbing layer and a photocatalytic layer, wherein the oxygen absorbing layer has a function of absorbing oxygen, and the photocatalytic layer has a function of catalyzing water decomposition. As shown in FIG. 1, the display panel includes a substrate 1, an organic electroluminescent device 2, a photocatalytic layer 3, and an oxygen absorbing layer 4, and the organic electroluminescent device 2 is disposed on the substrate 1; the photocatalytic layer 3 covers the organic electroluminescent device 2 and the substrate 1 adjacent to the organic electroluminescent device 2, the organic electroluminescent device 2 is packaged in a space formed by the photocatalytic layer 3 and the substrate 1; the oxygen absorbing layer 4 covers the photocatalytic layer 3 and the substrate 1 adjacent to the photocatalytic layer 3, and the organic electroluminescent device 2 and the photocatalytic layer 3 is packaged in the space formed by the oxygen absorbing layer 4 and the substrate 1.

Figure 2:
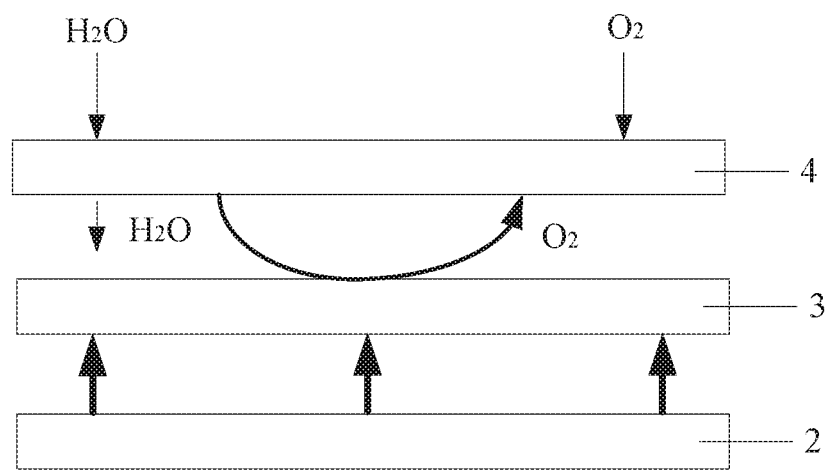
FIG. 2 is a schematic view showing the operation of a display panel according to an embodiment of the present disclosure.

Referring to the working diagram of the display panel shown in FIG. 2, visible light emitted from the organic electroluminescent device 2 is irradiated to the photocatalytic layer 3, and when oxygen and water vapor located outside the display panel reach the display panel shown in FIG. 1, firstly, oxygen and water vapor contact the oxygen absorbing layer 4, and the oxygen absorbing layer 4 absorbs oxygen, and the water vapor passes through the oxygen absorbing layer 4 to reach the photocatalytic layer 3, the photocatalytic layer 3 catalyzes water vapor decomposition under visible light irradiation to generate oxygen and hydrogen, and the generated oxygen is absorbed by the oxygen absorbing layer 4.

By the photocatalytic effect of the photocatalytic layer 3 under visible light, the water vapor entering the display panel is decomposed into oxygen and hydrogen by the photocatalytic layer 3, thereby achieving the purpose of eliminating water vapor to protect the organic electroluminescent device 2 from water vapor erosion. The photocatalytic layer 3 is composed of catalyst, and the catalyst has no problem of failure based on the characteristics that the catalyst does not participate in the reaction, and the photocatalytic layer can always perform water removal protection on the organic electroluminescent device. In addition, the catalyst does not change its chemical properties before and after the reaction, and it can be reused. Therefore, forming the display panel by the photocatalytic layer conforms to the green environmental protection concept. The oxygen absorbing layer 4 has an oxygen absorbing function, and then it can absorb external oxygen and photocatalyzed oxygen to protect the organic electroluminescent device 2 from oxygen attack.

There are various materials for preparing a photocatalytic layer for catalyzing water decomposition, and for example, the material of the photocatalyst layer may be a semiconductor photocatalytic material. In order to have a function of catalyzing water decomposition, the band gap of the semiconductor photocatalytic material is limited to be greater than 1.23 eV. In the photocatalytic reaction in practical, in order to improve the separation efficiency of electrons and holes, it is generally to load different metals (such as Pt, etc.) or metal oxides (such as $RuO_2$) on the surface of the catalyst to introduce the active sites of reducing hydrogen and oxygen oxide to promote hydrogen and oxygen to escape at different active sites on the catalyst surface. Due to the over potential of hydrogen and oxygen when they are precipitated on different metals or metal oxides, the band gap of the semiconductor photocatalytic material can be selected to be 2.0-2.2 eV or more.

There are various suitable semiconductor photocatalytic materials, such as at least one of a composite material of titanium dioxide, a composite material of zinc oxide and a composite material of carbon nitride. The composite material of titanium dioxide may be a composite material mainly composed of titanium dioxide, the composite material of zinc oxide may be a composite material mainly composed of zinc oxide. The semiconductor photocatalytic material may be selected as a composite material mainly composed of titanium dioxide.

When the semiconductor photocatalytic material includes at least one of a composite of titanium dioxide, a composite of zinc oxide, and a composite of carbon nitride, the thickness of the photocatalytic layer may be selected from 0.3 to 0.5 μm. The material type and layer thickness of the photocatalytic layer can be set according to practical conditions.

There are various materials for producing an oxygen absorbing layer for absorbing oxygen, such as at least one of an organic polyester-based material and an iron powder. The material of the oxygen absorbing layer may be an organic polyester material, and the organic polyester material contains a reactive group such as a double bond or a hydroxyl group in the main chain or the side chain, or the organic polyester material contains an active methylene group in the main chain. For example, olefin copolymer, polyisoprene, polybutadiene, nylon 6 (also known as polyamide-6), poly (meta-xylylene adipamide) (MXD6), (ethylene/vinyl alcohol) copolymer (E/VAL) and etc. The active iron powder can be used as a material for the oxygen absorbing layer, and the active iron powder can be used as a main component, and using the carbon powder, the sodium salt, and the halide as compounds for combination, and using the active iron powder and the compound to form the oxygen absorbing layer.

When the material for forming the oxygen absorbing layer is a combination of an organic polyester material, an iron powder, an organic polyurethane material, and an iron powder, the thickness of the oxygen absorbing layer may be selected from 0.6 to 1 μm. The material type and layer thickness of the oxygen absorbing layer can be set according to the practical setting.

The selections of material allow the oxygen absorbing layer to have a small thickness while absorbing oxygen, so that the photocatalytic layer has a small thickness while catalyzing the decomposition of water. The display panel made by the absorbing layer and the photocatalytic layer with a small thickness has the advantages such as small size, which is advantageous for the thin and light design of the display panel.

Figure 3:
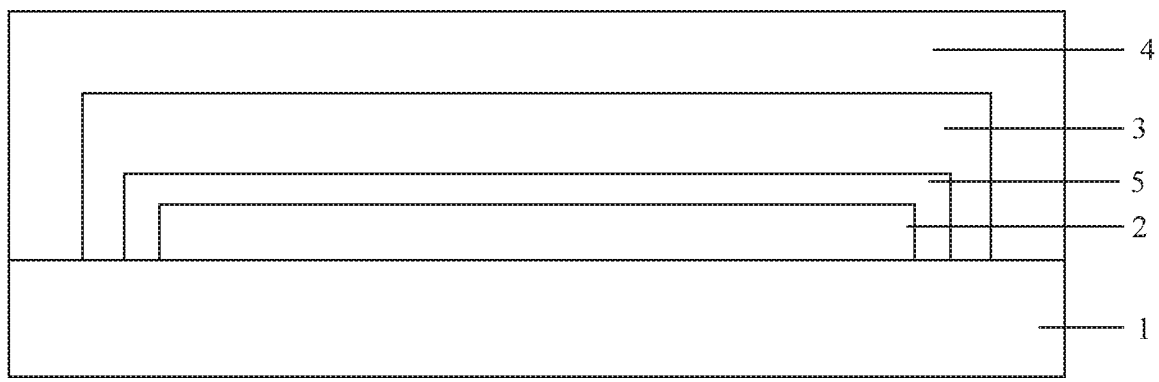
FIG. 3 is a schematic structural diagram of a second display panel according to an embodiment of the present disclosure.

In the display panel provided by the embodiment of the present disclosure, the photocatalytic layer catalytically decomposes water to generate hydrogen gas, and in order to prevent the generated hydrogen from adversely affecting the organic electroluminescent device, as shown in FIG. 3, the present disclosure adds a hydrogen absorbing layer for absorbing hydrogen in the display panel. The position of the hydrogen absorbing layer may be set according to practical conditions, for example, the hydrogen absorbing layer is disposed on a side of the photocatalytic layer facing away from the oxygen absorbing layer.

The material for making the hydrogen absorbing layer is a hydrogen storage material, and the hydrogen storage material may be various, such as a metal-organic framework (MOFs), which has the advantages of small density, large specific surface area, and high porosity. The structural size and pore size of the metal-organic framework can be controlled by assembly. There are many types of metal-organic frameworks, such as MOFs material with $ZnO4$ tetrahedral material as the center of metal cluster. For example, MOF-5 $(Zn_4O\ (BDC)_3$ in which BDC is 1,4-terephthalate; another example is MOF-177 $(Zn_4O(BTB)_2$, where BTB is 1,3,5-benzobenzoate, etc. The type of hydrogen storage material can be selected according to the practical situation.

Figure 4:
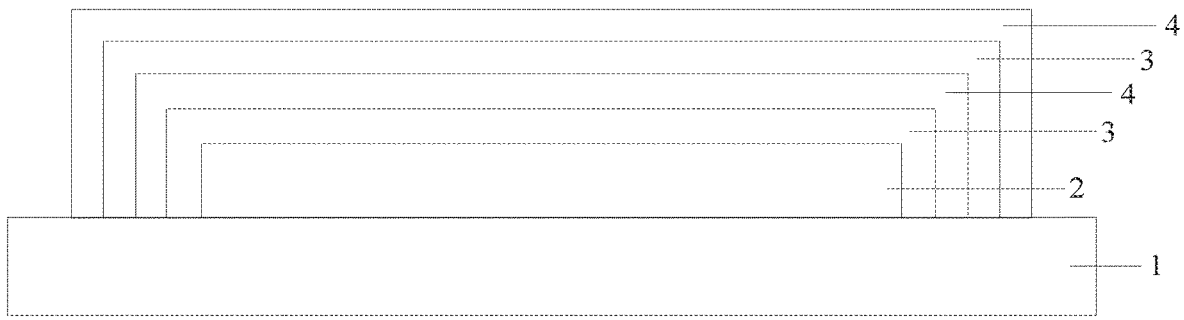
FIG. 4 is a schematic structural diagram of a third display panel according to an embodiment of the present disclosure.

In order to improve the packaging performance of the display panel, as shown in FIG. 4, the absorbing layer provided by the embodiment of the present disclosure may include at least two photocatalytic layers and at least two oxygen absorbing layers, at least two photocatalytic layers and at least two oxygen absorbing layers are alternately stacked. The arrangement of a plurality of oxygen absorbing layers improves the absorption performance of oxygen, and the arrangement of a plurality of photocatalytic layers improves the catalytic decomposition performance of water vapor, thereby effectively improves the packaging effect of the oxygen absorbing layer and the photocatalytic layer on the organic electroluminescent device, and the working performance of the organic electroluminescent device is ensured.

The material type and thickness of at least two photocatalytic layers may be the same or different. The material type and thickness of at least two oxygen absorbing layers may be the same or different. Based on the package design idea provided by the embodiments of the present disclosure, the material type, thickness, and number of layers of the photocatalytic layer and the absorbing layer may be set according to practical conditions.

As shown in FIG. 4, the display panel includes two photocatalytic layers 3 and two oxygen absorbing layers 4, and two photocatalytic layers 3 and two oxygen absorbing layers 4 are alternately stacked to form the multilayer protective structure of the photocatalytic layer 3-oxygen absorbing layer 4-photocatalytic layer 3-oxygen absorbing layer 4. Compared with the display panel shown in FIG. 1, the display panel shown in FIG. 4 has a better packaging effect.

Figure 5:
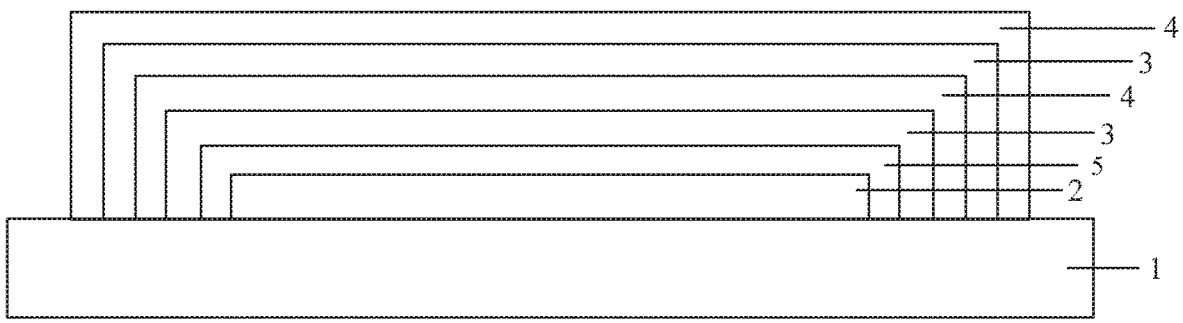
FIG. 5 is a schematic structural diagram of a fourth display panel according to an embodiment of the present disclosure.

In order to further avoid the adverse effect of hydrogen generated by water vapor decomposition on the organic electroluminescent device, as shown in FIG. 5, a hydrogen absorbing layer is added in the display panel. In this embodiment, the display panel includes two photocatalytic layers 3, two oxygen absorbing layers 4 and one hydrogen absorbing layer 5, and two photocatalytic layers 3 and two oxygen absorbing layers 4 are alternately laminated on the hydrogen absorbing layer 5 to constitute a multilayer protective structure of the hydrogen absorbing layer 5-the photocatalytic layer 3-the oxygen absorbing layer 4-the photocatalytic layer 3-the oxygen absorbing layer 4, the display panel in FIG. 5 has a better packaging effect compared with the display panel shown in FIG. 4.

The embodiment of the present disclosure further provides a display panel including the above described display panel provided by the embodiment of the present disclosure.

The embodiment of the present disclosure further provides a display device including the above described display panel provided by the embodiment of the present disclosure. The display device has the advantages of the display panel, and the advantages of the display device are not described herein again.

Figure 6:
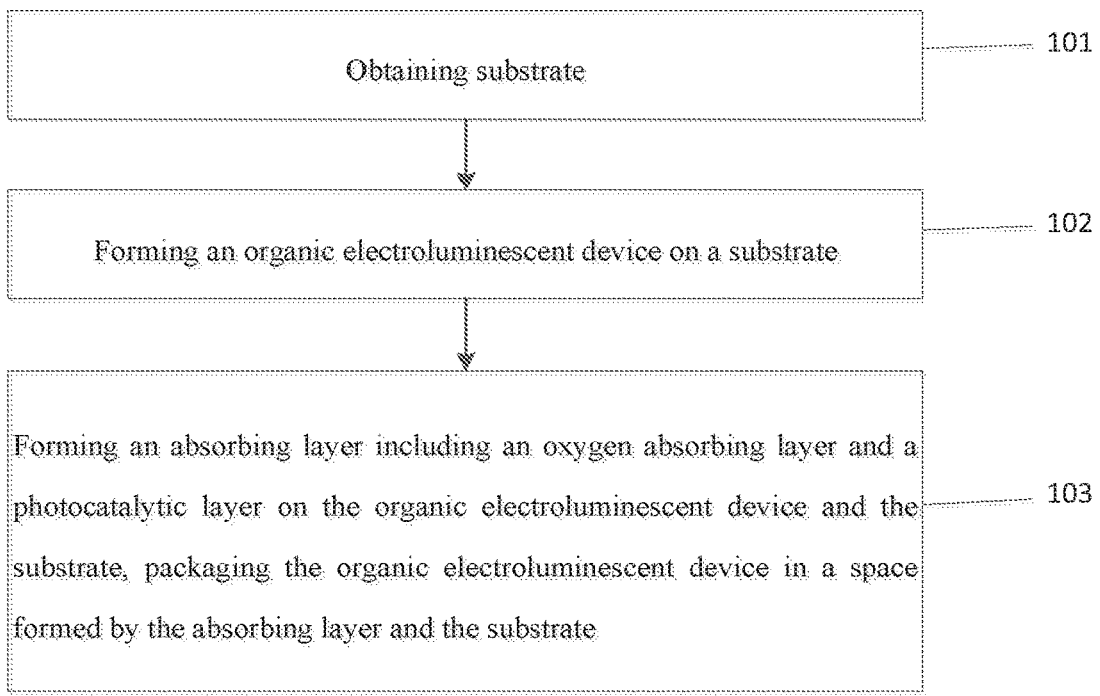
FIG. 6 is a flowchart of a method manufacturing for a first display panel according to an embodiment of the present disclosure.

The embodiment of the present disclosure further provides a manufacturing method for a display panel to produce the display panel provided by embodiments of the present disclosure. Referring to FIG. 6, a manufacturing method for a display panel according to embodiments of the present disclosure includes:

Step 101, providing a substrate.

When producing the display panel, firstly, providing a substrate, and the substrate may be pre-formed or be made on-site when making a display panel as needed. The substrate may be a glass substrate according to the kind of materials.

Step 102, forming an organic electroluminescent device on the substrate.

After providing the substrate, an organic electroluminescent device is formed on the substrate. The organic electroluminescent device mainly includes an anode, an organic light emitting material layer and a cathode, and the step of forming an organic electroluminescent device on the substrate may include: forming an anode on the substrate, forming an organic light-emitting material layer on the anode, and forming a cathode on the organic light-emitting material layer. The specific process for fabricating the anode, the organic light-emitting material layer, and the cathode can be set according to the practical conditions.

Step 103, forming an absorbing layer including an oxygen absorbing layer and a photocatalytic layer on the organic electroluminescent device and the substrate, and packaging the organic electroluminescent device in a space formed by the absorbing layer and the substrate.

After forming an organic electroluminescent device on the substrate, an absorbing layer for decomposing water vapor and absorbing oxygen from the outside and oxygen generated by water vapor decomposition is formed, the absorbing layer is covered on the organic electroluminescent device and the substrate, and the organic electroluminescent device is packaged in a space formed by the absorbing layer and the substrate.

The absorbing layer has the function of absorbing external oxygen, the arrangement of the absorbing layer prevents the intrusion of external oxygen, and prevents the organic electroluminescent device from being corroded by external oxygen, ensures the stability of the organic electroluminescent device, and so that the organic electroluminescent device have long service life.

The absorbing layer may include an oxygen absorbing layer and a photocatalytic layer for catalyzing water decomposition. When the absorbing layer includes the above functional layers, the step of forming an absorbing layer for absorbing an foreign matter on the organic electroluminescent device and the substrate may include: forming a photocatalytic layer covering the organic electroluminescent device and the substrate around the organic electroluminescent device; forming an oxygen absorbing layer, and the oxygen absorbing layer covers the absorbing layer and the substrate around the absorbing layer.

There are various processes for forming a photocatalytic layer, such as a vapor deposition process, a magnetron sputtering process (Sputter), etc., and the vapor deposition process may include various types such as plasma enhanced chemical vapor deposition process (PECVD). There are various processes for forming an oxygen absorbing layer, such as a vapor deposition process, a magnetron sputtering process, and the like. In addition to the above processes, the photocatalytic layer and the oxygen absorbing layer can also be produced by other suitable processes.

Figure 7:
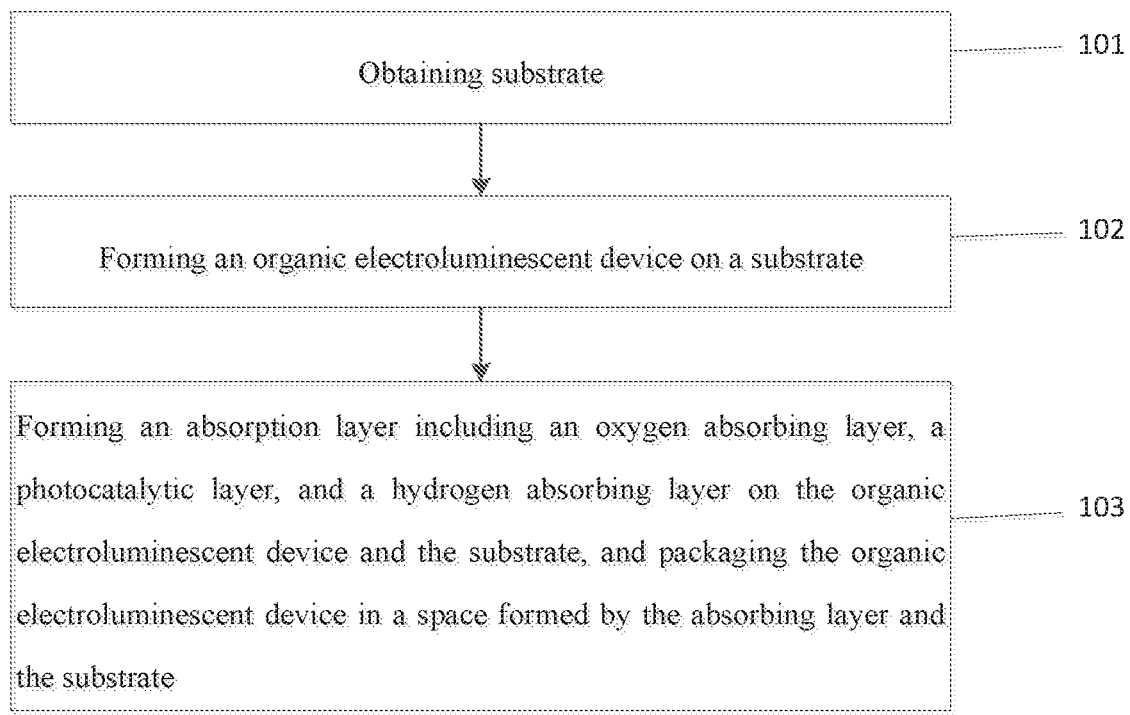
FIG. 7 is a flowchart of a manufacturing method for a second display panel according to an embodiment of the present disclosure.

Embodiments of the present disclosure also provide another manufacturing method for display panel for making a display panel provided by the embodiments of the present disclosure. Referring to FIG. 7, a manufacturing method for a display panel according to the embodiments of the present disclosure includes:

Step 101, providing a substrate.

When producing the display panel, firstly, providing a substrate, and the substrate may be pre-formed or be made on-site when making a display panel as needed. The substrate can be classified into a glass substrate or the like based on the kind of the material to be produced.

Step 102, forming an organic electroluminescent device on the substrate.

After the substrate is provided, an organic electroluminescent device is formed on the substrate. The organic electroluminescent device mainly includes an anode, an organic light emitting material layer and a cathode, and the step of forming an organic electroluminescent device on the substrate may include: forming an anode on the substrate, forming an organic light-emitting material layer on the anode, and forming a cathode on the organic light-emitting material layer. The specific process for fabricating the anode, the organic light-emitting material layer, and the cathode can be set according to the practical conditions.

Step 103, forming an absorbing layer including a hydrogen absorbing layer, a photocatalytic layer, and an oxygen absorbing layer on the organic electroluminescent device and the substrate, and packaging the organic electroluminescent device in a space formed by the absorbing layer and the substrate.

The present disclosure provides a display panel, a display device, and a method of manufacturing the same. The display panel provided by the present disclosure includes a substrate, an organic electroluminescent device, and an absorbing layer for absorbing foreign matter. The organic electroluminescent device is packaged in a space formed by the absorbing layer and the substrate. Since the absorbing layer actively absorbs foreign matter, the foreign matter is prevented from contacting with the organic electroluminescent device, and the organic electroluminescent device is prevented from being corroded by foreign matter. Therefore, the arrangement of the absorbing layer ensures the stability of the performance of the organic electroluminescent device, such that the organic electroluminescent device has a long service life.

The display panel, the display device and the manufacturing method thereof provided in the present disclosure are described as above in detail. The principles and embodiments of the present disclosure are illustrated herein by using specific examples. The above description of the embodiments is only for better understanding the method of the present disclosure and its main ideas. At the same time, for a person skill in the art, in accordance with the idea of the present disclosure, there will be changes in embodiments and applications. Therefore, the content of the specification should not be construed as limiting the disclosure.

What is claimed is:

1. A display panel comprising a substrate, an organic electroluminescent device, and an absorbing layer;
   the organic electroluminescent device is arranged on the substrate;
   the absorbing layer covers the organic electroluminescent device and the substrate;
   wherein the absorbing layer comprises an oxygen absorbing layer and a photocatalytic layer for catalyzing water decomposition;
   the photocatalytic layer covers the organic electroluminescent device and the substrate around the organic electroluminescent device, and the oxygen absorbing layer covers the photocatalytic layer and the substrate around the photocatalytic layer.

2. The display panel according to claim 1, wherein the absorbing layer further comprises a hydrogen absorbing layer covering the organic electroluminescent device and the substrate around the organic electroluminescent device, the photocatalytic layer covers the hydrogen absorbing layer and the substrate around the hydrogen absorbing layer.

3. The display panel according to claim 1, wherein the absorbing layer comprises at least two layers of the photocatalytic layer and at least two layers of the oxygen absorbing layer;
   the photocatalytic layer and the oxygen absorbing layer are alternately stacked.

4. The display panel according to claim 3, wherein the material of the photocatalytic layer is a semiconductor photocatalytic material having a band gap greater than 1.23 eV.

5. The display panel according to claim 4, wherein the semiconductor photocatalytic material comprises at least one of a composite material of titanium oxide, a composite material of zinc oxide, and a composite material of carbon nitride.

6. The display panel according to claim 2, wherein the material of the hydrogen absorbing layer is a hydrogen storage material.

7. The display panel of claim 6, wherein the hydrogen storage material comprises metal-organic frameworks (MOFs).

8. The display panel of claim 7, wherein the metal-organic framework is a MOFs material centered on $ZnO_4$.

9. The display panel of claim 8, wherein the metal-organic framework is MOF-5 $(Zn_4O(BDC)_3)$, wherein BDC is 1,4-terephthalate.

10. The display panel according to claim 8, wherein the metal-organic framework is MOF-177 $(Zn_4O(BTB)_2)$, wherein BTB is 1,3,5-benzotribenzoate.

11. The display panel according to claim 5, wherein the photocatalytic layer has a thickness of about 0.3 to 0.5 μm.

12. The display panel according to claim 1, wherein the material of the oxygen absorbing layer comprises at least one of an organic polyester-based material and iron powder.

13. The display panel according to claim 12, wherein said oxygen absorbing layer has a thickness of about 0.6 to 1 μm.

14. A display device comprising the display panel according to claim 13.

15. A manufacturing method for a display panel according to claim 1, the method comprising:
   providing the substrate;
   forming the organic electroluminescent device on the substrate;
   forming the absorbing layer on the organic electroluminescent device and the substrate;
   wherein the absorbing layer comprises the oxygen absorbing layer and the photocatalytic layer for catalyzing water decomposition, and the step of forming the absorbing layer on the organic electroluminescent device and the substrate comprises:
   forming the photocatalytic layer covering the organic electroluminescent device and the substrate around the organic electroluminescent device,
   forming the oxygen absorbing layer covering the photocatalytic layer and the substrate around the photocatalytic layer.

16. The manufacturing method for a display panel according to claim 15, wherein the steps of forming the photocatalytic layer further comprises:
   forming a hydrogen absorbing layer, which is located on a surface of the photocatalytic layer away from the oxygen absorbing layer, wherein the hydrogen absorbing layer covers the organic electroluminescent device and the substrate around the organic electroluminescent device, the photocatalytic layer covers the hydrogen absorbing layer and the substrate around the hydrogen absorbing layer.

17. The manufacturing method for a display panel according to claim 16, wherein the steps of forming the photocatalytic layer comprises:
   forming the photocatalytic layer by vapor deposition or magnetron sputtering;
   the steps of forming the oxygen absorbing layer comprises:
   forming the oxygen absorbing layer by vapor deposition or magnetron sputtering.

18. The manufacturing method for a display panel according to claim 17, wherein the material of the photocatalytic layer is a semiconductor photocatalytic material, the band gap of the semiconductor photocatalytic material is greater than 1.23 eV, and the material of the oxygen absorbing layer comprises at least one of an organic polyester material and an iron powder.

19. The manufacturing method for a display panel according to claim 18, wherein the photocatalytic layer has a thickness of about 0.3 to 0.5 μm, and the oxygen absorbing layer has a thickness of about 0.6 to 1 μm.

* * * * *